US012695135B2

(12) United States Patent

Su

(10) Patent No.: US 12,695,135 B2

(45) Date of Patent: Jul. 28, 2026

(54) FAN ASSEMBLY, POWER SUPPLY DEVICE, AND METHOD FOR MANUFACTURING POWER SUPPLY DEVICE

(71) Applicant: CONTEMPORARY AMPEREX TECHNOLOGY (HONG KONG) LIMITED, Hong Kong (CN)

(72) Inventor: Haibin Su, Ningde City (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 772 days.

(21) Appl. No.: 18/164,604

(22) Filed: Feb. 5, 2023

(65) Prior Publication Data

US 2023/0187732 A1 Jun. 15, 2023

Related U.S. Application Data

(63) Continuation of application No. PCT/CN2021/087035, filed on Apr. 13, 2021.

(51) Int. Cl.
H01M 10/00 (2006.01)
H01M 10/613 (2014.01)
(Continued)

(52) U.S. Cl.
CPC ..... H01M 10/6563 (2015.04); H01M 10/613 (2015.04); H05K 7/20145 (2013.01); H05K 7/20172 (2013.01)

(58) Field of Classification Search
CPC ............ H01M 10/6563; H01M 10/613; H05K 7/20172; H05K 7/20145; Y02E 60/10
See application file for complete search history.

(56) References Cited

U.S. PATENT DOCUMENTS 9,565,785 B2 2/2017 Tsai
10,655,643 B2 5/2020 Miwa
(Continued)

FOREIGN PATENT DOCUMENTS

CN 202486686 U 10/2012
CN 208402328 U * 1/2019
(Continued)

OTHER PUBLICATIONS

Zheng et al., Based On Pack Group Technology Modularized Battery Group Of 18650 Lithium Battery, Oct. 2019, See the Abstract. (Year: 2019).*

(Continued)

*Primary Examiner* — Tiffany Legette
*Assistant Examiner* — Monique M Wills
(74) *Attorney, Agent, or Firm* — K&L Gates LLP

(57) ABSTRACT

A fan assembly, a power supply device, and a method for manufacturing a power supply device. The present application provides a fan assembly, including: airst mounting member provided with a first opening; a second mounting member provided with a second opening; a flexible connecting sleeve having a first end connected to the first mounting member and a second end connected to the second mounting member, the flexible connecting sleeve being configured to communicate the first opening with the second opening; and a fan, which is arranged within the flexible connecting sleeve and is configured to promote flow of gas from the first opening to the second opening. The fan assembly is connected between an element compartment and an air duct, can adapt to a mounting error, connects the element compartment to the air duct in a sealed manner, and has a good tolerance.

15 Claims, 7 Drawing Sheets

(51) Int. Cl.
  H01M 10/6563     (2014.01)
  H05K 7/20       (2006.01)

(56)        References Cited

U.S. PATENT DOCUMENTS

| | | |
|---|---|---|
| 2014/0241875 A1 | 8/2014 | Tsai |
| 2015/0099454 A1 | 4/2015 | Hikmet |
| 2016/0079613 A1 | 3/2016 | Gurunathan et al. |
| 2017/0114803 A1 | 4/2017 | Miwa |
| 2018/0191043 A1 | 7/2018 | Nelson et al. |
| 2019/0200481 A1 | 6/2019 | Avvaru et al. |

FOREIGN PATENT DOCUMENTS

| | | | |
|---|---|---|---|
| CN | 110235535 A | | 9/2019 |
| CN | 209526128 U | * | 10/2019 |
| CN | 111328376 A | | 6/2020 |
| CN | 211653592 U | | 10/2020 |
| CN | 112366391 A | | 2/2021 |
| WO | 2012018067 A1 | | 2/2012 |

OTHER PUBLICATIONS

Su et al., A Container, Jan. 2019, , See the Abstract. (Year: 2019).*
The international search report received in the corresponding International Application PCT/CN2021/087035, mailed Jan. 13, 2022.
The written opinion received in the corresponding International Application PCT/CN2021/087035, mailed Jan. 13, 2022.
The extended European search report received in the corresponding European Application 21933484.4, mailed May 23, 2023.
The Grant Notice received in the counterpart CN Application No. 202180067465.7, dated Jul. 4, 2025, 6 pages with English translation.
Communication pursuant to Article 94(3) EPC received in the counterpart EP Application No. 21933484.4, dated Apr. 30, 2025, 7 pages.

* cited by examiner

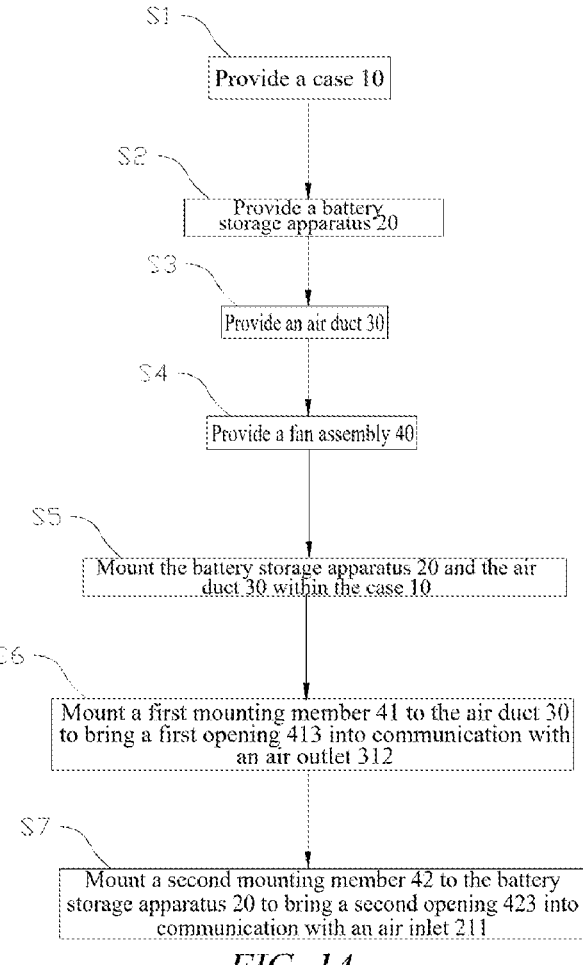

S1 — Provide a case 10

S2 — Provide a battery storage apparatus 20

S3 — Provide an air duct 30

S4 — Provide a fan assembly 40

S5 — Mount the battery storage apparatus 20 and the air duct 30 within the case 10

S6 — Mount a first mounting member 41 to the air duct 30 to bring a first opening 413 into communication with an air outlet 312

S7 — Mount a second mounting member 42 to the battery storage apparatus 20 to bring a second opening 423 into communication with an air inlet 211

*FIG. 14*

FAN ASSEMBLY, POWER SUPPLY DEVICE, AND METHOD FOR MANUFACTURING POWER SUPPLY DEVICE

CROSS-REFERENCE TO RELATED APPLICATIONS

This application is a continuation of International Application No. PCT/CN2021/087035, filed Apr. 13, 2021, and entitled "FAN ASSEMBLY, POWER SUPPLY DEVICE, AND METHOD FOR MANUFACTURING POWER SUPPLY DEVICE", which is incorporated herein by reference in its entirety.

TECHNICAL FIELD

The present application relates to the technical field of battery cooling, and in particular, to a fan assembly, a power supply device, and a method for manufacturing a power supply device.

BACKGROUND ART

In engineering applications, many engineering devices, such as power supply devices and large computer cases, include heat generation elements. The heat generation element is arranged within an element compartment. The heat generation element generates heat during operation, and the heat generated by the heat generation element needs to be dissipated from the element compartment to ensure that the heat generation element runs within a preset operating temperature range. The engineering device further includes an air duct in which cold air is transported, and a fan assembly brings the air duct into communication with the element compartment, so as to promote entry of the cold air into the element compartment from the air duct, and take away the heat generated by the heat generation element during the operation by means of the cold air.

During an actual assembly process of the engineering device, there is a mounting error between the element compartment and the air duct, and a relative position of an air outlet of the air duct and an air inlet of the element compartment is deviated, so that two ends of the fan assembly cannot be connected to the element compartment and the air duct in a sealed manner, which not only leads to an air volume loss, but also cannot effectively cool the heat generation element, thus reducing the overall heat dissipation performance of the engineering device.

SUMMARY OF THE INVENTION

The present application provides a fan assembly, which is connected between an element compartment and an air duct, can adapt to a mounting error, connects the element compartment to the air duct in a sealed manner, and has a good tolerance.

The present application further provides a power supply device and a method for manufacturing a power supply device, wherein a fan assembly is connected between a battery storage apparatus and an air duct, can adapt to a mounting error, connects the battery storage apparatus to the air duct in a sealed manner, and has a good tolerance.

An embodiment of the present application provides a fan assembly, comprising: a first mounting member provided with a first opening; a second mounting member provided with a second opening; a flexible connecting sleeve having a first end connected to the first mounting member and a second end connected to the second mounting member, the flexible connecting sleeve being configured to communicate the first opening with the second opening; and a fan, which is arranged within the flexible connecting sleeve and is configured to promote flow of gas from the first opening to the second opening.

The fan assembly is mounted between the air duct and the element compartment. When the actual relative position of the first opening and the second opening deviates from an ideal relative position, the flexible connecting sleeve can adapt to the deviation of the relative position of the first opening and the second opening through deformation, without affecting the sealing performance of the fan assembly, thereby avoiding an air volume loss caused by poor sealing.

In addition, the fan assembly according to this embodiment of the present application further has the following additional technical features.

According to some embodiments of the present application, the fan assembly further comprises: a first fixing ring configured to fix the first end of the flexible connecting sleeve to the first mounting member, wherein the first end of the flexible connecting sleeve is fitted over the first mounting member, and the first fixing ring is fitted over the first end of the flexible connecting sleeve.

This form is simple in structure and easy to assemble. On the basis that the first end of the flexible connecting sleeve is fitted over the first mounting member, the first fixing ring can be further fitted over the first end of the flexible connecting sleeve, so as to implement peripheral-side sealing of the first end of the flexible connecting sleeve, so that the first end of the flexible connecting sleeve is connected to the first mounting member in a peripheral-side sealed manner, so as to avoid air leakage caused by a slit at a joint between the first end of the flexible connecting sleeve and the first mounting member.

According to some embodiments of the present application, the fan assembly further comprises: a first fixing member, wherein the first fixing ring is provided with a first mounting hole, the first end of the flexible connecting sleeve is provided with a second mounting hole, and the first fixing member is configured to pass through the first mounting hole and the second mounting hole and be connected to the first mounting member, so as to fix the first end of the flexible connecting sleeve to the first mounting member.

This form is not only easy to assemble, but can also fix the first end of the flexible connecting sleeve to the first mounting member in a circumferentially sealed manner by means of the first fixing ring, so as to avoid air leakage caused by loosening of the first end of the flexible connecting sleeve during use.

According to some embodiments of the present application, the fan assembly further comprises: a second fixing ring configured to fix the second end of the flexible connecting sleeve to the second mounting member, wherein the second end of the flexible connecting sleeve is fitted over the second mounting member, and the second fixing ring is fitted over the second end of the flexible connecting sleeve.

This form is simple in structure and easy to assemble. On the basis that the second end of the flexible connecting sleeve is fitted over the second mounting member, the second fixing ring can be further fitted over the second end of the flexible connecting sleeve, so as to implement peripheral-side sealing of the second end of the flexible connecting sleeve, so that the second end of the flexible connecting sleeve is connected to the second mounting member in a peripheral-side sealed manner, so as to avoid air leakage caused by a slit at a joint between the second end of the flexible connecting sleeve and the second mounting member.

According to some embodiments of the present application, the fan assembly further comprises: a second fixing member, wherein the second fixing ring is provided with a third mounting hole, the second end of the flexible connecting sleeve is provided with a fourth mounting hole, and the second fixing member is configured to pass through the third mounting hole and the fourth mounting hole and be connected to the second mounting member, so as to fix the second end of the flexible connecting sleeve to the second mounting member.

This form is not only easy to assemble, but can also fix the second end of the flexible connecting sleeve to the second mounting member in a circumferentially sealed manner by means of the second fixing ring, so as to avoid air leakage caused by loosening of the second end of the flexible connecting sleeve during use.

According to some embodiments of the present application, the first mounting member comprises a first base plate and a first connecting member, the first base plate is provided with the first opening, the first connecting member is arranged on the side of the first base plate facing the flexible connecting sleeve, the first connecting member is arranged around the first opening, and the first end of the flexible connecting sleeve is fitted over the first connecting member.

Through the provision of the first connecting member, an outer peripheral side of the first connecting member is attached to the first end of the flexible connecting sleeve, so that the first connecting member can be connected to the first end of the flexible connecting sleeve in a peripheral-side sealed manner; and the provision of the first base plate facilitates connection to the element compartment via the first base plate.

According to some embodiments of the present application, the first mounting member comprises a first sub-base plate, a second sub-base plate, and a first connecting member, the first opening is formed in the first connecting member, the first sub-base plate and the second sub-base plate are symmetrically arranged with respect to the first connecting member, and the first end of the flexible connecting sleeve is fitted over the first connecting member.

Through the provision of the first connecting member, an outer peripheral side of the first connecting member is attached to the first end of the flexible connecting sleeve, so that the first connecting member can be connected to the first end of the flexible connecting sleeve in a peripheral-side sealed manner; and The symmetrical arrangement of the first sub-base plate and the second sub-base plate with respect to the first connecting member facilitates connection to the element compartment via the first sub-base plate and the second sub-base plate and can further reduce the weight of the first mounting member.

According to some embodiments of the present application, the second mounting member comprises a second base plate and a second connecting member, the second base plate is provided with the second opening, the second connecting member is arranged on the side of the second base plate facing the flexible connecting sleeve, the second connecting member is arranged around the second opening, and the second end of the flexible connecting sleeve is fitted over the second connecting member.

Through the provision of the second connecting member, an outer peripheral side of the second connecting member is attached to the second end of the flexible connecting sleeve, so that the second connecting member can be connected to the second end of the flexible connecting sleeve in a peripheral-side sealed manner; and the provision of the second base plate facilitates connection to the element compartment via the second base plate.

According to some embodiments of the present application, the fan is fixed to the side of the second base plate facing the flexible connecting sleeve, the second connecting member is arranged around the fan, and the second connecting member is provided with a wiring hole for allowing a wire harness of the fan to pass through.

The second connecting member is provided with the wiring hole, the wire harness of the fan passes through the wiring hole, and an end portion of the wire harness is exposed to the exterior of the fan assembly and is connected to an external power supply and control unit. When a plurality of fan assemblies are used, a layout design can be simplified when the wire harness of the fan is connected to the external power supply and control unit.

According to some embodiments of the present application, the fan assembly further comprises: a cover plate, which is arranged opposite the second base plate, is fixed to the fan, and is configured to limit the wire harness of the fan between the cover plate and the second base plate.

According to some embodiments of the present application, the fan is fixed to the second mounting member. The fixing of the fan to the second mounting member enables the fan to be as close as possible to the second opening, thereby increasing an air speed at the second opening of the fan assembly. The increasing of the air discharge speed of the fan assembly can improve the air discharge efficiency of the fan assembly, promote blowing of cold air into the interior of the element compartment, and increase an effective cooling area, so as to fully cool a heat generation element. In addition, the wire harness is limited between the cover plate and the second base plate, which can prevent the wire harness from being drawn into the fan.

According to some embodiments of the present application, the flexible connecting sleeve is made of a fabric or resin material, is soft in texture, can flexibly deform, has a good wear resistance, is thick and windproof, and can prevent cold air from seeping through the flexible connecting sleeve.

An embodiment of the present application further provides a power supply device, comprising: a case; a battery storage apparatus, configured to store a battery, mounted within the case and provided with an air inlet; an air duct mounted within the case and provided with an air outlet; and a fan assembly mentioned above, wherein the first mounting member is mounted to the air duct to bring the first opening into communication with the air outlet, and the second mounting member is mounted to the battery storage apparatus to bring the second opening into communication with the air inlet.

The foregoing fan assembly is used to connect the air outlet of the air duct to the air inlet of the battery storage apparatus, and can adapt to a deviation of relative position of the air inlet and the air outlet caused by a mounting error when the air duct and the battery storage apparatus are assembled within the case, thereby avoiding air leakage and ensuring a good heat dissipation consistency of the battery storage apparatus in the power supply device.

According to some embodiments of the present application, the air duct comprises an air duct body and a guide assembly, the air outlet is arranged on the air duct body, the guide assembly is fixed to the air duct body, and the guide assembly is configured to guide the first mounting member to slide in an extension direction of the guide assembly, such that the air outlet is in communication with the first opening.

The provision of the guide assembly in the air duct body can guide the first mounting member to slide along the extension direction of the guide assembly, thereby ensuring relative position of the first mounting member and the air duct, facilitating communication between the air outlet and the first opening, and ensuring sealed connection between the fan assembly and the air duct.

According to some embodiments of the present application, the power supply device further comprises: a third fixing member, wherein the first mounting member is provided with a fifth mounting hole, the air duct is provided with a sixth mounting hole, and the third fixing member is configured to pass through the fifth mounting hole and be connected to the sixth mounting hole, so as to fix the first mounting member to the air duct; and the air duct further comprises a fitting portion, the first mounting member further comprises a limiting portion, the limiting portion is configured to abut against the fitting portion to limit sliding of the first mounting member along the guide assembly, and the limiting portion is configured to align the fifth mounting hole with the sixth mounting hole when the limiting portion abuts against the fitting portion.

The abutment between the limiting portion and the fitting portion can locate the position of the first mounting member relative to the air duct, and facilitate connection between the first mounting member and the air duct via the first mounting member by a worker, so as to improve the peripheral-side sealing performance between the first mounting member and the air duct.

According to some embodiments of the present application, the power supply device further comprises: a sealing member arranged between the second mounting member and the battery storage apparatus and surrounding the air inlet, to implement sealed connection between the second mounting member and the battery storage apparatus.

The sealing member can seal a peripheral side of the second opening, and prevent the loss of cold caused by lateral leakage of cold air from a slit between the second mounting member and the battery storage apparatus, thereby ensuring the heat dissipation consistency of the battery storage apparatus.

An embodiment of the present application further provides a method for manufacturing a power supply device, the method comprising:

providing a case;
  providing a battery storage apparatus which is configured to store a battery and is provided with an air inlet;
  providing an air duct which is provided with an air outlet;
  providing a fan assembly which comprises:
  a first mounting member provided with a first opening;
  a second mounting member provided with a second opening;
  a flexible connecting sleeve having a first end connected to the first mounting member and a second end connected to the second mounting member, the flexible connecting sleeve being configured to communicate the first opening with the second opening; and
  a fan, which is arranged within the flexible connecting sleeve and is configured to promote flow of gas from the first opening to the second opening;
  mounting the battery storage apparatus and the air duct within the case;
  mounting the first mounting member to the air duct to bring the first opening into communication with the air outlet; and mounting the second mounting member to the battery storage apparatus to bring the second opening into communication with the air inlet.

The deformation of the flexible connecting sleeve is used to adapt to a change in the relative position of the first mounting member and the second mounting member, so that the peripheral-side sealing performance of the air inlet and the air outlet can be kept even if there is a mounting error between the battery storage apparatus and the air duct, thereby not only avoiding the air volume loss caused by air leakage, but also ensuring the heat dissipation consistency of the battery storage apparatus in the power supply device.

Additional aspects and advantages of the present application will be set forth in part in the following description, and in part will be apparent from the following description, or may be learned by practice of the present application.

BRIEF DESCRIPTION OF THE DRAWINGS

In order to more clearly illustrate the technical solutions of the embodiments of the present application, the accompanying drawings to be used in the description of the embodiments of the present application will be described briefly below. Obviously, the accompanying drawings in the following description show merely some embodiments of the present application. For those of ordinary skill in the art, other accompanying drawings can also be obtained according to the accompanying drawings without involving any creative efforts.

FIG. 14 is a schematic flowchart of a method for manu-facturing a power supply device disclosed in an embodiment of the present application.

Figures 1, 2, 3, 4:
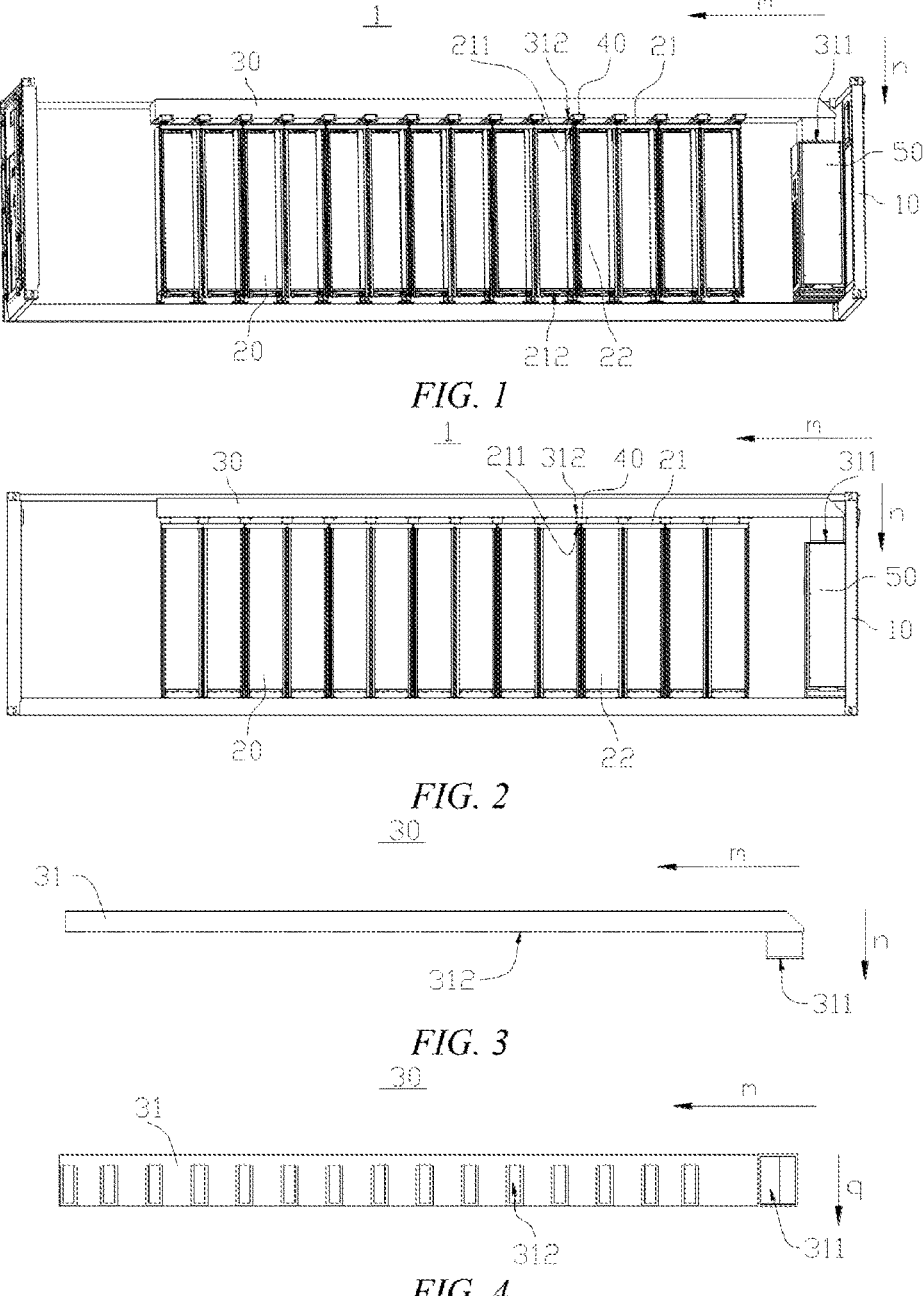
FIG. 1 is a schematic diagram of a partial structure of a power supply device disclosed in an embodiment of the present application.
FIG. 2 is a front schematic structural diagram of a partial structure of a power supply device disclosed in an embodiment of the present application.
FIG. 3 is a front schematic structural diagram of an air duct in a power supply device disclosed in an embodiment of the present application.
FIG. 4 is a bottom schematic structural diagram of an air duct in a power supply device disclosed in an embodiment of the present application.

In the accompanying drawings, the figures are not drawn to scale.

List of reference numerals: 1—power supply device; 10—case; 20—battery storage apparatus; 21—mounting frame; 211—air inlet; 212—ventilation opening; 22—bat-tery unit; 30—air duct; 31—air duct body; 311—cold air inlet; 312—air outlet; 313—sixth mounting hole; 32—guide assembly; 321—first guide member; 322—second guide member; 33—fitting portion; 40—fan assembly; 41—first mounting member; 411—first base plate; 4111—first side of the first base plate; 4112—second side of the first base plate; 4113—third side of the first base plate; 4114—fourth side of the first base plate; 4115—fifth mounting hole; 412—first connecting member; 413—first opening; 414—limiting por-tion; 415—first sub-base plate; 416—second sub-base plate; 42—second mounting member; 421—second base plate; 4211—first side of the second base plate; 4212—second side of the second base plate; 4213—seventh mounting hole; 422—second connecting member; 423—second opening; 424—wiring hole; 43—flexible connecting sleeve; 431—first end; 4311—second mounting hole; 432—second end; 4321—fourth mounting hole; 44—fan; 441—fan body; 4411—fan housing; 4412—blade; 4413—elongated through hole; 442—wire harness; 443—air intake side; 444—air discharge side; 45—first fixing ring; 451—first mounting hole; 46—second mounting hole; 461—third mounting hole; 47—cover plate; 471—wire harness cavity; 472—cover plate opening; 481—first fixing member; 482—sec-ond fixing member; 483—fourth fixing member; 50—air cooling apparatus; and 60—sealing member.

DETAILED DESCRIPTION OF EMBODIMENTS

Implementations of the present application are further describes in detail below with reference to the accompany-ing drawings and embodiments. The detailed description of the following embodiments and the accompanying drawings are used to illustrate the principle of the present application by way of example, but should not be used to limit the scope of the present application, that is, the present application is not limited to the described embodiments.

In the description of the present application, it should be noted that, unless otherwise specified, "a plurality of" means at least two. An orientation or a position relationship indi-cated by the terms "upper", "lower", "left", "right", "inner", "outer", etc. is merely for convenience of describing the present application and simplifying the description, rather than indicating or implying that an indicated apparatus or element must have a particular orientation or be constructed and operated in a particular orientation, and therefore cannot be construed as limiting the present application. In addition, the terms "first", "second", "third", etc. are merely for the purpose of description, and shall not be construed as indi-cating or implying relative importance. "Perpendicular" does not mean to be strictly perpendicular, but within an allowable error range. "Parallel" does not mean to be strictly parallel, but within an allowable error range.

The orientation terms in the following description all indicate directions shown in the drawings, and do not impose a limitation on a specific structure in the present application. In the description of the present application, it should be further noted that, the term "mount", "connected", and "connect" should be interpreted in the broad sense unless explicitly defined and limited otherwise, and, for example, may mean a fixed connection, a detachable con-nection or an integral connection; or may mean a direct connection, or an indirect connection by means of an inter-mediary. For those of ordinary skill in the art, specific meanings of the foregoing terms in the present application may be understood in specific circumstances.

In the related art, an engineering device comprises an element compartment, an air duct, and an air cooling appa-ratus. A heat generation element is arranged within the element compartment, and generates heat during operation. The air duct comprises a cold air inlet and an air outlet, the cold air inlet is connected to the air cooling apparatus, and the air outlet is connected to the element compartment by means of a conventional fan assembly. The air cooling apparatus feeds cold air into the air duct, the conventional fan assembly promotes entry of the cold air into the element compartment, and the cold air takes away the heat generated by the heat generation element during operation.

However, during an actual assembly process of the engi-neering device, there is inevitably a mounting error between the element compartment and the air duct, which leads to a deviation of relative position of the air outlet of the air duct and an air inlet of the element compartment. Since the conventional fan assembly has a rigid structure, it is difficult to ensure that two ends of the fan assembly are respectively connected to the air outlet and the air inlet in a sealed manner when there is a deviation of actual relative position of the air outlet and the air inlet, which is prone to cause air leakage. The air inlet of the element compartment has an intake air volume smaller than a discharge air volume of the air outlet of the air duct, and the cold air is lost from joints between the fan assembly and the element compartment and the air duct, which not only leads to a loss of cold air, but also reduces the heat dissipation consistency of the element compartment.

Based on the foregoing problems, an embodiment of the present application provides a novel fan assembly, which is mounted between an air duct and an element compartment of an engineering device. The novel fan assembly can adapt to a deviation of relative position of an air outlet of the air duct and the element compartment, and therefore can still be in sealed connection with the air outlet and an air inlet even if there is a deviation of relative position of the air outlet and the air inlet, so that there is no air leakage at joints between the novel fan assembly and the element compartment and the air duct.

In some embodiments of the present application, the engineering device is a power supply device, and the heat generation element is a battery, which generates heat during operation.

In other embodiments, the engineering device may also be a large computer case, and the heat generation element may be a chip. Further, the engineering device may also comprise a thermostatic element, and hot air is sent out from the air duct. By supplying the hot air into the element compartment, the thermostatic element in the element compartment is kept operating at a high enough temperature.

Taking a power supply device 1 as an example, a specific structure of a fan assembly in an embodiment of the present application and a relationship of connection to other appa-ratuses will be described in detail below.

FIGS. 1 and 2 respectively show a schematic isometric view and a front schematic structural diagram of a partial structure of a power supply device 1 disclosed in an embodi-ment of the present application.

As shown in FIGS. 1 and 2, the power supply device 1 comprises a case 10, a battery storage apparatus 20, an air duct 30, a fan assembly 40, and an air cooling apparatus 50. The battery storage apparatus 20 is configured to store a battery, and the battery storage apparatus 20 and the air duct 30 are mounted within the case 10. The battery storage apparatus 20 is provided with an air inlet 211, and the air duct 30 extends in a direction m. The air duct 30 comprises a cold air inlet 311 and an air outlet 312. The cold air inlet 311 is connected to the air cooling apparatus 50, and cold air output by the air cooling apparatus 50 enters the air duct 30 through the cold air inlet 311 and is transported in the direction m. The fan assembly 40 brings the air outlet 312 into communication with the air inlet 211, to introduce the cold air from the air duct 30 into the battery storage apparatus 20 in a direction n, so as to cool the battery stored in the battery storage apparatus 20.

In the embodiments of the present application, the directions m, q, and n are respectively length, width and height directions of the power supply device 1 disclosed in the embodiments of the present application.

The air cooling apparatus 50 may be arranged inside the case to make rational use of a space inside the case. The air cooling apparatus 50 is placed in the case with a limited volume, so that the power supply device 1 has a compact structure.

In embodiments, it is also possible that the air cooling apparatus 50 is arranged outside the case, and the air duct 30 and the air cooling apparatus 50 are connected to each other outside the case.

FIG. 1 shows a schematic isometric view of a partial structure of a power supply device 1 disclosed in an embodiment of the present application. As shown in FIG. 1, a mounting frame 21 is arranged on the side of the battery storage apparatus 20 close to the air duct 30, the mounting frame 21 is provided with an air inlet 211 in communication with the interior of the battery storage apparatus 20, and the cold air enters the interior of the battery storage apparatus 20 from the air inlet 211 to cool the battery stored in the battery storage apparatus 20. The battery storage apparatus 20 is further provided with a ventilation opening 212, and the cold air enters the battery storage apparatus 20 to cool the battery, and then leaves the battery storage apparatus 20 through the ventilation opening 212, so as to take away heat emitted by the battery during power supply.

As shown in FIGS. 1 and 2, the ventilation opening 212 and the air inlet 211 may be respectively arranged at two opposite ends of the battery storage apparatus 20 in the direction n, such that the cold air is guided to enter the battery storage apparatus 20 in the direction n from the air inlet 211 and then continues to flow in the direction n, passes across a plurality of batteries and take away heat emitted by the batteries during power supply, so that cold carried by the cold air can be fully used, and a better cooling effect can be achieved with the same cold air volume.

In embodiments, it is also possible that the ventilation opening 212 is arranged on a side wall of the battery storage apparatus 20, the battery storage apparatus 20 comprises a first end and a second end opposite to each other in the direction n, and the side wall refers to a wall body between the first end and the second end of the battery storage apparatus 20.

FIG. 2 is a front schematic structural diagram of a partial structure of a power supply device 1 disclosed in an embodiment of the present application. As shown in FIG. 2, the side of the air duct 30 close to the battery storage apparatus 20 is provided with an air outlet 312, and the air outlet 312 and the air inlet 211 are arranged opposite each other in the direction n. The fan assembly 40 is used to connect the air outlet 312 to the air inlet 211. The provision of the fan assembly 40 can promote entry of the cold air from the air duct 30 into the battery storage apparatus 20 in the direction n, so as to cool the battery placed in the battery storage apparatus 20.

FIGS. 3 and 4 respectively show front and bottom schematic structural diagrams of an air duct 30 of a power supply device 1 in an embodiment of the present application.

As shown in FIGS. 2, 3, and 4, the air duct 30 extends in the direction m and feeds air in the direction m, a plurality of air outlets 312 are provided, and the plurality of air outlets 312 are arranged at intervals in the direction m. Correspondingly, the side of the battery storage apparatus 20 close to the air duct 30 is provided with a plurality of air inlets 211, and the air inlets 211 correspond to the air outlets 312 on a one-to-one basis. Each air outlet 312 is connected to the corresponding air inlet 211 by means of one fan assembly 40, and the cold air in the air duct 30 enters, from each air outlet 312, the corresponding air inlet 211 in the direction n, and a plurality of streams of cold air jointly cool the batteries stored in the battery storage apparatus 20.

The fan assembly 40 in this embodiment of the present application is connected between the air duct 30 and the battery storage apparatus 20. The fan assembly 40 can adapt to a deviation of relative position of the air outlet 312 of the air duct 30 and the air inlet 211 of the battery storage apparatus 20, and therefore can still be connected to the air outlet 312 and the air inlet 211 in a sealed manner even if there is a deviation of relative position of the air outlet 312 and the air inlet 211.

Figure 5:
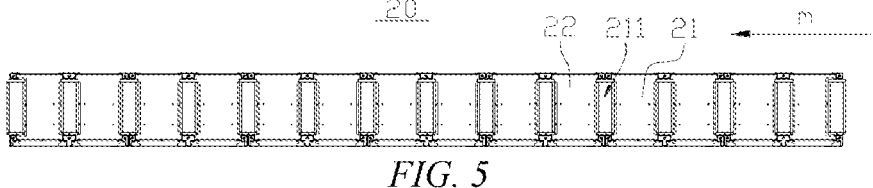
FIG. 5 is a top schematic structural diagram of a battery storage apparatus in a power supply device disclosed in an embodiment of the present application.

FIG. 5 shows a top schematic structural diagram of a battery storage apparatus 20 in a power supply device 1 disclosed in an embodiment of the present application.

As shown in FIG. 5, in some embodiments of the present application, the battery storage apparatus 20 stores a plurality of battery units 22 spaced apart each other in the direction m, and each battery unit 22 comprises a plurality of batteries. Each battery unit 22 is arranged between two adjacent air inlets 211, and each air inlet 211 is arranged between two adjacent battery units 22. In this form, cold air can be blown from two sides of each battery unit 22 to the battery unit 22, and each battery in the battery unit 22 can be cooled, thereby avoiding a phenomenon that a battery located on the side away from the air inlet 211 cannot be blown by the cold air due to mutual shielding of the batteries, and improving the heat dissipation uniformity of the battery storage apparatus 20.

In other embodiments, it is also possible that only one battery is arranged inside the battery storage apparatus 20, and each air inlet 211 feeds a stream of cold air to cool the battery sufficiently and uniformly.

Figure 6:
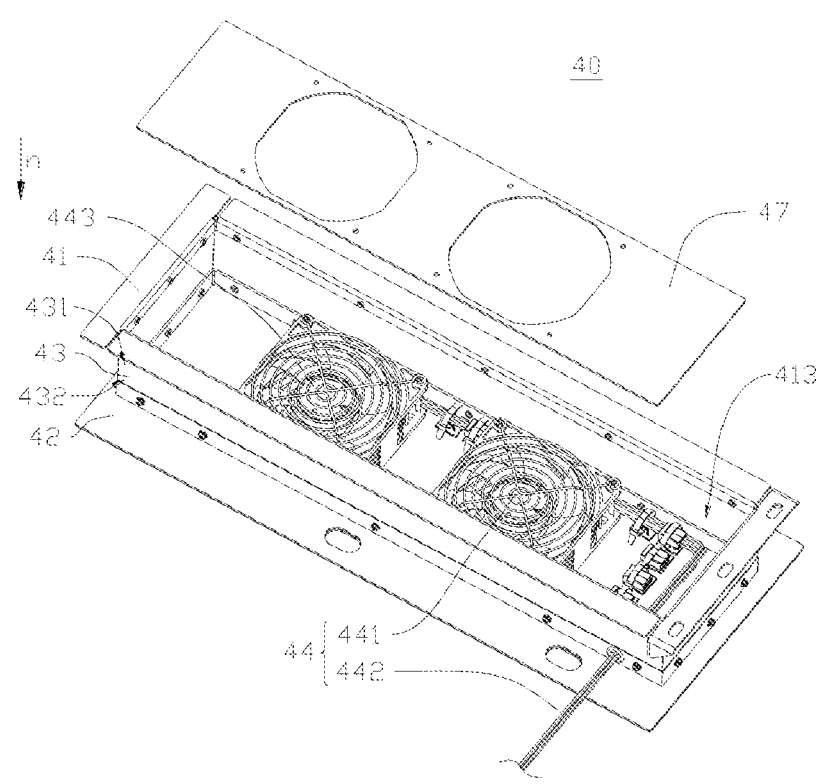
FIG. 6 is a top schematic structural diagram of a fan assembly disclosed in an embodiment of the present application.
Figure 7:
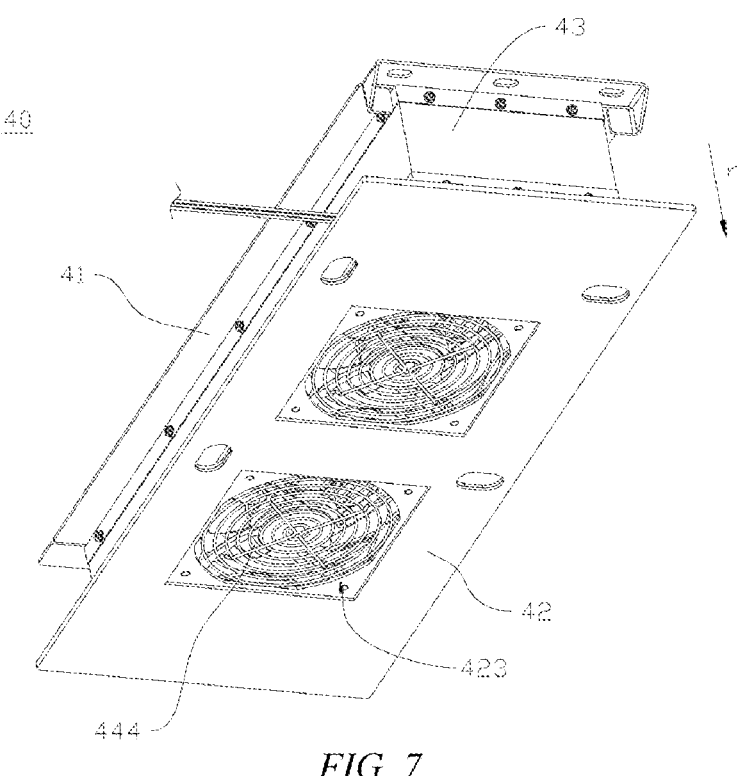
FIG. 7 is a bottom schematic structural diagram of a fan assembly disclosed in an embodiment of the present application.

FIGS. 6 and 7 respectively show top and bottom schematic structural diagrams of a fan assembly 40 disclosed in an embodiment of the present application. As shown in FIGS. 6 and 7, the fan assembly 40 comprises a first mounting member 41, a second mounting member 42, a flexible connecting sleeve 43, and a fan 44. Two ends of the flexible connecting sleeve 43 are respectively a first end 431 and a second end 432, the first end 431 is connected to the first mounting member 41, the second end 432 is connected to the second mounting member 42, and the fan 44 is arranged within the flexible connecting sleeve 43.

The flexible connecting sleeve 43 is made of a deformable material, and can flexibly connect the first mounting member 41 to the second mounting member 42 by means of the first end 431 and the second end 432, so as to allow a relative position of the first mounting member 41 and the second mounting member 42 to change, thereby adapting to a position deviation of the air duct 30 and the battery storage apparatus 20 during assembly.

In some embodiments of the present application, the flexible connecting sleeve 43 is made of a fabric or resin material, is soft in texture, and can flexibly deform, so as to allow the relative position of the first mounting member 41 and the second mounting member 42 to change. In addition, this material has a high surface density, which can avoid the loss of cold caused by the seepage of cold air through the flexible connecting sleeve 43.

For example, the flexible connecting sleeve 43 may be a rubber sleeve, which can not only flexibly deform, but can also have a good elasticity, so as to further allow for a greater position deviation between the first mounting member 41 and the second mounting member 42 through tensile deformation.

FIGS. 6 and 7 respectively show top and bottom schematic structural diagrams of a fan assembly disclosed in an embodiment of the present application. As shown in FIGS. 6 and 7, a first mounting member 41 is provided with a first opening 413, a second mounting member 42 is provided with a second opening 423, and a flexible connecting sleeve 43 is configured to communicate the first opening 413 with the second opening 423. Gas enters the interior of the fan assembly 40 from the first opening 413 and leaves the fan assembly 40 from the second opening 423. The fan 44 promotes flow of the gas in the direction n inside the flexible connecting sleeve 43, so as to promote flow of the gas from the first opening 413 to the second opening 423.

In some embodiments of the present application, two fans 44 are provided, the flexible connecting sleeve 43 has a rectangular cross section (that is, a section perpendicular to the direction n), and the two fans 44 are arranged at intervals in a length direction of the rectangular air intake cross section, so as to uniformly promote flow of the gas in the flexible connecting sleeve 43. Correspondingly, as shown in FIG. 7, two second openings 423 are provided, and an air discharge side 444 of each fan 44 corresponds to one second opening 423.

In other embodiments, the number and arrangement of the fans 44 may be flexibly set according to the shape of an air intake/discharge cross section of the fan assembly 40, so as to promote uniform air discharge of the fan assembly 40. For example, the fan assembly 40 has a square air intake/discharge cross section, four fans 44 are provided, and the four fans 44 are uniformly arranged inside the flexible connecting sleeve 43 in a square array and are located on the same plane parallel to the air intake/discharge cross section of the fan assembly 40. For another example, the fan assembly 40 has a circular air intake/discharge cross section, six fans 44 are provided, and the six fans 44 are uniformly arranged inside the flexible connecting sleeve 43 in an annular array and are located on the same plane parallel to the air intake/discharge cross section of the fan assembly 40. For still another example, the air intake/discharge cross section of the fan assembly 40 is regularly polygonal or circular, one fan 44 is provided, and the fan 44 is centrally arranged inside the flexible connecting sleeve 43.

The fan 44 is fixed to the second mounting member 42, so that the fan 44 can be as close as possible to the air inlet 211 of the battery storage apparatus 20 (referring to FIG. 5), thereby increasing the air speed at the air inlet 211, enabling cold air to blow into the battery storage apparatus 20, and increasing an effective cooling area to cool a larger number of batteries.

In other embodiments, it is also possible that the fan 44 is fixed to the first mounting member 41 to promote flow of an airflow near the first opening 413 in the direction n. For another example, it is also possible that the fan 44 is arranged in a region between the first mounting member 41 and the second mounting member 42 by means of an additional support, so as to promote gas flow in a balanced manner.

Figure 8:
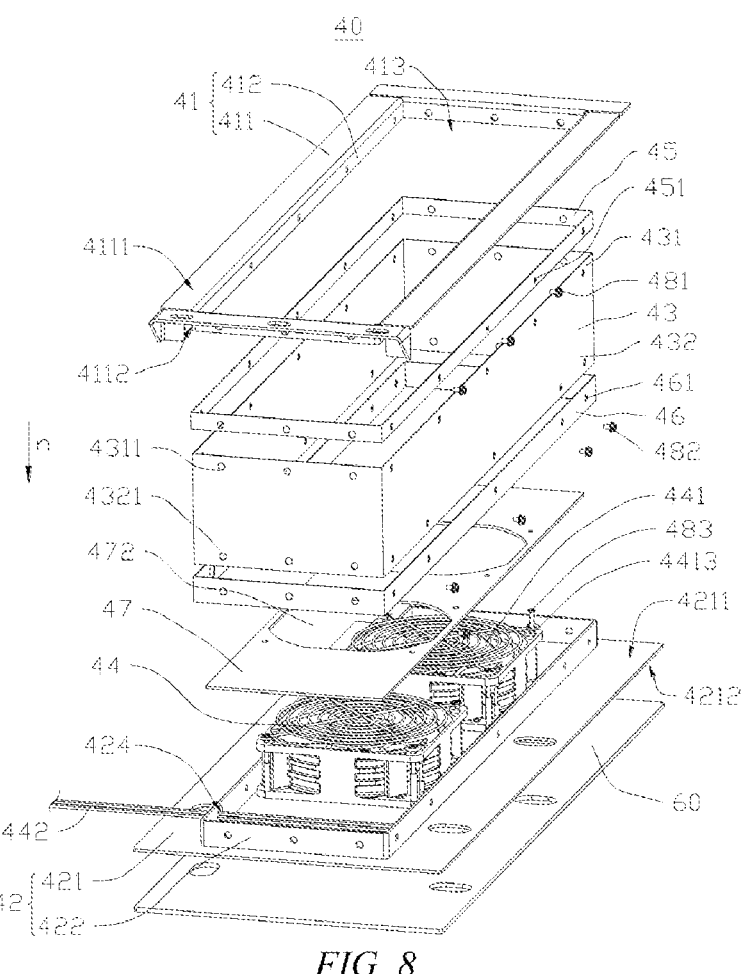
FIG. 8 is an exploded view of a fan assembly disclosed in an embodiment of the present application.

FIG. 8 shows an exploded view of a fan assembly 40 disclosed in an embodiment of the present application. A specific structural form of the fan assembly 40 is illustrated in detail below.

As shown in FIG. 8, in some embodiments of the present application, the fan assembly 40 comprises a first fixing ring 45 configured to fix a first end 431 of the flexible connecting sleeve 43 to a first mounting member 41. The first end 431 is fitted over the first mounting member 41, and the first fixing ring 45 is fitted over the first end 431.

This form is simple in structure and easy to assemble. On the basis that the first end 431 of the flexible connecting sleeve 43 is fitted over the first mounting member 41, the first fixing ring 45 can be further fitted over the first end 431, so as to implement peripheral-side sealing of the first end 431, so that the first end 431 is connected to the first mounting member 41 in a peripheral-side sealed manner, so as to avoid air leakage caused by a slit at a joint between the first end 431 and the first mounting member 41.

The first fixing ring 45 may be a rigid component, such as a plastic ring and a metal ring. When the first fixing ring 45 is fitted over the first end 431 of the flexible connecting sleeve 43, and the first end 431 is fitted over the first mounting member 41, the first fixing ring 45 and the first mounting member 41 jointly clamp the first end 431 to implement the peripheral-side sealing of the first end 431; moreover, it is easy to assemble the first fixing ring 45 to the first mounting member 41, and the assembly is simple, firm and reliable.

In other embodiments, it is also to connect the first end 431 of the flexible connecting sleeve 43 to the first mounting member 41 in another manner. For example, an opening of the first end 431 of the flexible connecting sleeve 43 is circumferentially expandable and is elastic. The opening of the first end 431 is expanded and then fitted over the first mounting member 41, and the opening of the first end 431 shrinks in a circumferential direction under its own elasticity and is tightly fitted over the first mounting member 41; or a circle of glue is applied to an inner edge of the first end 431, and the first end 431 is bonded to the first mounting member 41, etc.

Further, the fan assembly 40 further comprises a first fixing member 481. The first fixing ring 45 is provided with a first mounting hole 451, the first end 431 of the flexible connecting sleeve 43 is provided with a second mounting hole 4311, and the first fixing member 481 is configured to pass through the first mounting hole 451 and the second mounting hole 4311 and be connected to the first mounting member 41, so as to fix the first end 431 to the first mounting member 41.

This form is not only easy to assemble, but can also fix the first end 431 of the flexible connecting sleeve 43 to the first mounting member 41 in a circumferentially sealed manner by means of the first fixing ring 45, so as to avoid air leakage caused by loosening of the first end 431 during use.

For example, the first fixing member 481 may be a screw, and the first mounting member 41 is provided with a threaded hole corresponding to the first mounting hole 451, so that the first fixing member 481 is in a threaded fit with the threaded hole.

For another example, the first fixing member 481 may be a rivet for riveting the first fixing ring 45 to the first mounting member 41.

In other embodiments, it is also possible to connect the first end 431 to the first mounting member 41 in a peripheral-side sealed manner by winding a steel wire, a fabric strip, a rubber band, etc.

As shown in FIG. 8, in some embodiments of the present application, the first mounting member 41 comprises a first base plate 411 and a first connecting member 412, the first base plate 411 is provided with the first opening 413, the first connecting member 412 is arranged on the side of the first base plate 411 facing the flexible connecting sleeve 43, the first connecting member 412 is arranged around the first opening 413, and the first end 431 of the flexible connecting sleeve 43 is fitted over the first connecting member 412.

Specifically, two opposite sides of the first base plate 411 in the direction n are respectively a first side 4111 of the first base plate and a second side 4112 of the first base plate. The first connecting member 412 is mounted to the second side 4112 of the first base plate. The first opening 413 is a hole in the first mounting member 41. In some embodiments of the present application, the first opening 413 is a hole penetrating the first base plate 411 in the direction n. The first connecting member 412 is arranged around the first opening 413. It can be understood that the first base plate 411 may be of an integrated structure or a spliced structure, and one or more first connecting members 412 surrounding the first opening 413 may be provided. For example, when one first connecting member 412 is provided, the first connecting member 412 may be configured as an annular structure and arranged around the first opening 413. For another example, when a plurality of first connecting members 412 are provided, the first connecting members 412 may be arranged at intervals around the first opening 413.

Through the provision of the first connecting member 412, an outer peripheral side of the first connecting member 412 is circumferentially attached to the first end 431 of the flexible connecting sleeve 43, and the first fixing ring 45 and the first connecting member 412 jointly clamp the first end 431 to implement the peripheral-side sealing of the first end 431; and the provision of the first base plate 411 enables the first mounting member 41 to have a sufficient area for assembly with other components.

Figures 9, 10, 11:
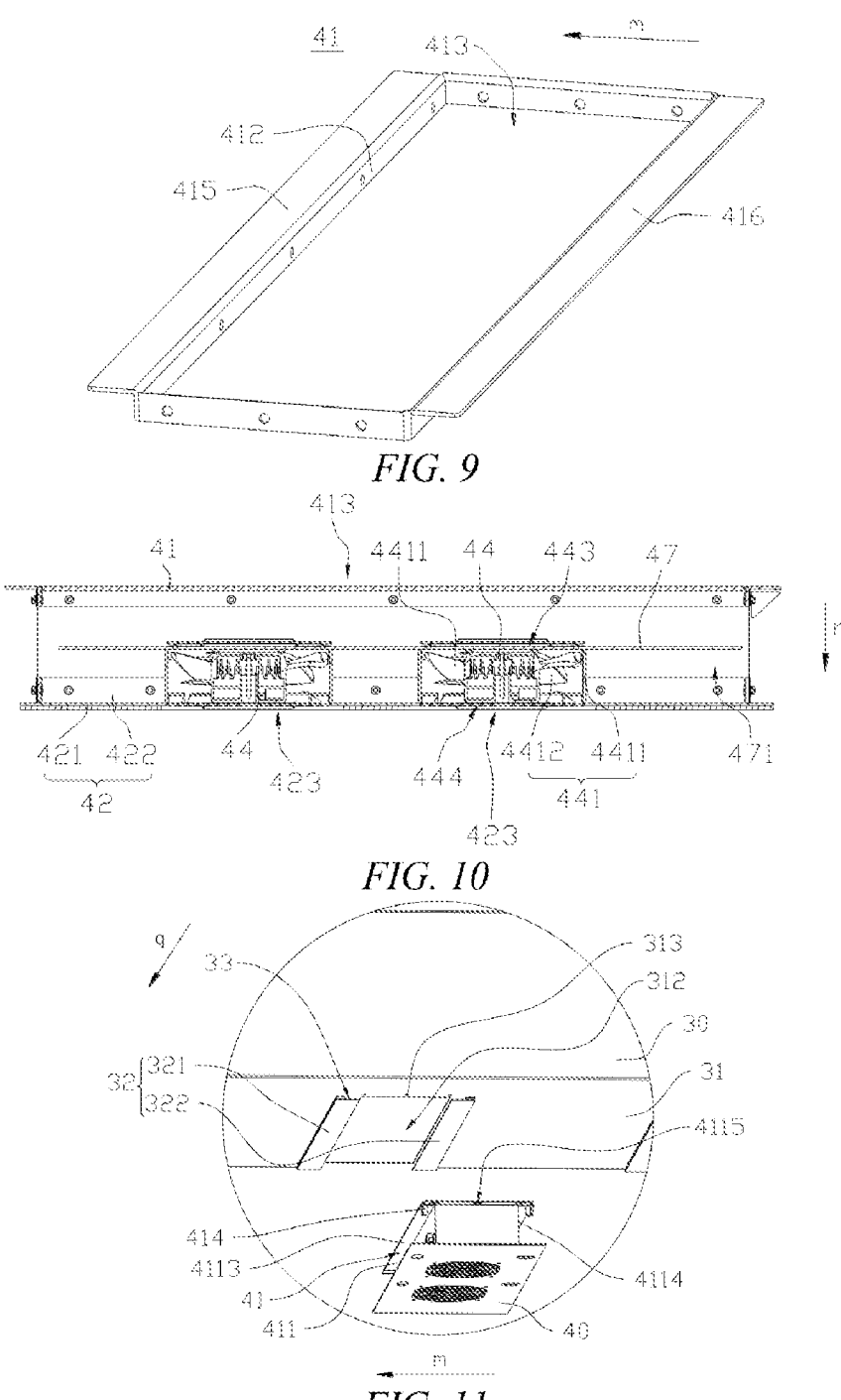
FIG. 9 is a schematic structural diagram of a first mounting member in another form in a fan assembly disclosed in an embodiment of the present application.
FIG. 10 is a perspective cross-sectional schematic diagram of a fan assembly disclosed in an embodiment of the present application.
FIG. 11 is a schematic diagram of assembly of a fan assembly disclosed in an embodiment of the present application and an air duct.

FIG. 9 shows a schematic structural diagram of a first mounting member 41 in another form in a fan assembly 40 disclosed in an embodiment of the present application, and illustrates a specific structural form of the first mounting member 41 in another form.

As shown in FIG. 9, in other embodiments, a first opening 413 is a hole formed in a first connecting member 412. The first mounting member 41 comprises a first sub-base plate 415, a second sub-base plate 416, and a first connecting member 412. The first opening 413 is formed in the first connecting member 412, and the first sub-base plate 415 and the second sub-base plate 416 are symmetrically arranged with respect to the first connecting member 412. The symmetrical arrangement of the first sub-base plate 415 and the second sub-base plate 416 with respect to the first connecting member 412 not only provides a sufficient mounting area for the first mounting member 41, but can also reduce the weight of the first mounting member 41, thereby reducing the total weight of the fan assembly 40 and facilitating the mounting of the fan assembly 40.

Alternatively, the first mounting members 41 may comprise three or four sub-base plates, and the four sub-base plates are arranged around the first opening 413 of the first connecting member 412.

Alternatively, the first mounting member 41 may be in another form, and for example, may be of a sleeve structure or a plate-like structure with a hole, which can also be connected to the first end 431 of the flexible connecting sleeve 43, and bring the first opening 413 into communication with the flexible connecting sleeve 43.

Referring to FIG. 8 again, the fan assembly 40 further comprises a second fixing ring 46 configured to fix a second end 432 of the flexible connecting sleeve 43 to the second mounting member 42. The second end 432 of the flexible connecting sleeve 43 is fitted over the second mounting member 42, and the second fixing ring 46 is fitted over the second end 432 of the flexible connecting sleeve 43.

The second fixing ring 46 may be a rigid component, such as a plastic ring and a metal ring. When the second fixing ring 46 is fitted over the second end 432 of the flexible connecting sleeve 43, and the second end 432 is fitted over the second mounting member 42, the second fixing ring 46 and the second mounting member 42 jointly clamp the second end 432 to implement the peripheral-side sealing of the second end 432; moreover, it is easy to assemble the second fixing ring 46 to the second mounting member 42, and the assembly is simple, firm and reliable.

In other embodiments, it is also to connect the second end 432 of the flexible connecting sleeve 43 to the second mounting member 42 in another manner. For example, an opening of the second end 432 of the flexible connecting sleeve 43 is circumferentially expandable and is elastic. The opening of the second end 432 is expanded and then fitted over the second mounting member 42, and the opening of the second end 432 shrinks in a circumferential direction under its own elasticity and is tightly fitted over the second mounting member 42; or a circle of glue is applied to an inner edge of the second end 432, and the second end 432 is bonded to the second mounting member 42, etc.

The fan assembly 40 further comprises a second fixing member 482. The second fixing ring 46 is provided with a third mounting hole 461, the second end 432 of the flexible connecting sleeve 43 is provided with a fourth mounting hole 4321, and the second fixing member 482 is configured to pass through the third mounting hole 461 and the fourth mounting hole 4321 and connected to the second mounting member 42, so as to fix the second end 432 of the flexible connecting sleeve 43 to the second mounting member 42.

This form is not only easy to assemble, but can also fix the second end 432 of the flexible connecting sleeve 43 to the second mounting member 42 in a circumferentially sealed manner by means of the second fixing ring 46, so as to avoid air leakage caused by loosening of the second end 432 during use.

For example, the second fixing member 482 may be a screw, and the second fixing member 482 is provided with a threaded hole corresponding to the third mounting hole 461, so that the second fixing member 482 is in a threaded fit with the threaded hole.

For another example, the second fixing member 482 may be a rivet for riveting the second fixing ring 46 to the second mounting member 42.

In other embodiments, it is also possible to connect the second end 432 to the second mounting member 42 in a peripheral-side sealed manner by winding a steel wire, a fabric strip, a rubber band, etc.

FIG. 8 shows an exploded view of a fan assembly 40 disclosed in an embodiment of the present application. As shown in FIG. 8, the second mounting member 42 comprises a second base plate 421 and a second connecting member 422, the second base plate 421 is provided with a second opening 423 (referring to FIG. 7), the second connecting member 422 is arranged on the side of the second base plate 421 facing the flexible connecting sleeve 43, the second connecting member 422 is arranged around the second opening 423, and the second end 432 of the flexible connecting sleeve 43 is fitted over the second connecting member 422.

Specifically, two sides of the second base plate 421 in a thickness direction thereof are respectively a first side 4211 of the second base plate and a second side 4212 of the second base plate. The first side 4211 of the second base plate is the side facing the flexible connecting sleeve 43, the second connecting member 422 is mounted on the first side 4211 of the second base plate, and the second side 4212 of the second base plate is used for connection to other components.

Through the provision of the second connecting member 422, an outer peripheral side of the second connecting member 422 is circumferentially attached to the second end 432 of the flexible connecting sleeve 43, and the second fixing ring 46 and the second connecting member 422 jointly clamp the second end 432 to implement the peripheral-side sealing of the second end 432; and the provision of the second base plate 421 enables the second mounting member 42 to have a sufficient area for assembly with other components.

In other embodiments, it is also possible that the second mounting member 42 is in another form, and, for example, is of a sleeve structure or a plate-like structure with a hole, which can also be connected to the second end 432 of the flexible connecting sleeve 43, and bring the second opening 423 into communication with the flexible connecting sleeve 43.

FIG. 8 shows an exploded view of a fan assembly 40 disclosed in an embodiment of the present application. As shown in FIG. 8, further, the power supply device 1 further comprises a sealing member 60. The sealing member 60 is arranged on the second side 4212 of the second base plate of the second mounting member 42 to implement sealed connection between the second mounting member 42 and other components.

Specifically, the sealing member 60 is arranged on the second side 4212 of the second base plate, and the sealing member 60 is provided with a via hole for making way for the second opening 423 (referring to FIG. 7).

The sealing member 60 can seal a peripheral side of the second opening 423, and prevent the loss of cold caused by lateral leakage of cold air from a mounting slit between the second base plate 421 and other components.

For example, the sealing member 60 is a rubber plate. In other embodiments, it is also possible that the sealing member 60 is made of another material with waterproof performance and elasticity, such as a silicone pad.

FIG. 8 shows an exploded view of a fan assembly 40 disclosed in an embodiment of the present application. As shown in FIG. 8, a fan 44 is fixed to the first side 4211 of the second base plate, the second connecting member 422 is arranged around the fan 44, and the second connecting member 422 is provided with a wiring hole 424 for allowing a wire harness 442 to pass through. Correspondingly, the second fixing ring 46 and the second end 432 of the flexible connecting sleeve 43 are also provided with via holes corresponding to the wiring hole 424, and the wire harness 442 passes through the wiring hole 424, the flexible connecting sleeve 43 and the second fixing ring 46 and then extends out of the fan assembly 40.

As shown in FIG. 8, four corners of a fan body 441 are provided with elongated through holes 4413, and the power supply device 1 further comprises fourth fixing members 483. Each fourth fixing member 483 passes through the respective elongated through hole 4413 to fasten and connect the fan body 441 to the second base plate 421, thereby preventing separation of the fan 44 from the second base plate 421 caused by loosening during long-term rotation. For example, the fourth fixing member 483 is a screw or a bolt.

The fan 44 is fixed to the second mounting member 42; and the second connecting member 422 is provided with the wiring hole 424, the wire harness 442 passes through the wiring hole 424, and an end portion of the wire harness 442 is exposed to the exterior of the fan assembly 40 and is connected to an external power supply and control unit. When a plurality of fan assemblies 40 are used, the layout design can be simplified when the wire harness 442 is connected to the external power supply and control unit.

FIG. 10 shows a perspective cross-sectional schematic diagram of a fan assembly 40 disclosed in an embodiment of the present application. A specific structural form of the fan 44 will be described in detail below.

As shown in FIG. 10, the fan 44 is arranged inside the flexible connecting sleeve 43, and is configured to promote flow of gas from the first opening 413 to the second opening 423, so as to increase the air discharge speed of the fan assembly 40. The fan 44 comprises a fan body 441 and a wire harness 442 (referring to FIG. 8). The fan body 441 comprises a fan housing 4411 and blades 4412 mounted inside the fan housing 4411. The fan 44 is an axial flow fan, and an air intake/discharge direction of the fan 44 extends in the direction n. The fan 44 comprises an air intake side 443 and an air discharge side 444 in the direction n. One end of the wire harness 442 is connected to the fan body 441, and the other end thereof extends out of the fan 44 to connect the fan body 441 to the external control unit and power supply.

Still referring to FIGS. 8 and 10, optionally, the fan assembly 40 further comprises a cover plate 47. The cover plate 47 and the second base plate 421 are oppositely arranged on two sides of the fan 44 in the direction n, and the cover plate 47 is fixed to the fan 44 and is configured to limit the wire harness 442 between the cover plate 47 and the second base plate 421.

Specifically, the cover plate 47 is provided with a cover plate opening 472 for exposing the air intake side 443 of the fan 44, and the second base plate 421, the cover plate 47 and the flexible connecting sleeve 43 can enclose together to form a wire harness cavity 471. The wire harness cavity 471 is in communication with neither of the air intake side 443 and the air discharge side 444 of the fan 44. After passing through the wire harness cavity 471, the wire harness 442 leaves the wire harness cavity 471 through the wiring hole 424 and is connected to the external power supply and control unit. During the operation of the fan 44, the wire harness 442 will not be drawn into the fan 44 from the air intake side 443 and the air discharge side 444, thereby ensuring the safe operation of the fan 44.

FIG. 11 shows a schematic diagram of assembly of a fan assembly 40 disclosed in an embodiment of the present application and an air duct 30.

As shown in FIG. 11, a first mounting member 41 of the fan assembly 40 is connected to the air duct 30, so that an air outlet 312 of the air duct 30 is in communication with the fan assembly 40. The air duct 30 comprises an air duct body 31 and a guide assembly 32. The air outlet 312 is arranged in the air duct body 31, and the guide assembly 32 is fixed to the air duct body 31. The guide assembly 32 extends in a direction q, and the guide assembly 32 is configured to guide the first mounting member 41 to slide in the direction q, so as to bring the air outlet 312 into communication with the first opening 413 (referring to FIG. 10) and ensure that the fan assembly 40 is connected to the air duct 30 in a sealed manner.

As shown in FIG. 11, in some embodiments of the present application, the guide assembly 32 comprises a first guide member 321 and a second guide member 322. The first guide member 321 and the second guide member 322 both extend in the direction q. The air outlet 312 is arranged in the air duct body 31, and the first guide member 321 and the second guide member 322 are fixed to the air duct body 31 and are located on two opposite sides of the air outlet 312. The first mounting member 41 is inserted between the first guide member 321 and the second guide member 322 in the direction q. Two opposite sides of the first base plate 411 in the direction m are respectively a third side 4113 of the first base plate and a fourth side 4114 of the first base plate. The third side 4113 of the first base plate is in a sliding fit with the first guide member 321, and the fourth side 4114 of the first base plate is in a sliding fit with the second guide member 322.

The provision of the first guide member 321 and the second guide member 322 can guide the fan assembly 40 to be inserted between the first guide member 321 and the second guide member 322 in the direction q, so as to locate the relative position of the fan assembly 40 and the air duct body 31, and avoid air leakage at a joint between the fan assembly 40 and the air duct body 31 caused by a deviation of relative position of the fan assembly and the air duct body.

Optionally, the first guide member 321 and the second guide member 322 each are of an insertion groove structure. On the basis of guiding the fan assembly 40 to slide in the direction q, the fan assembly 40 is further defined to be parallel to a side wall of the air duct body 31 provided with the air outlet 312, so as to reduce a mounting slit between the fan assembly 40 and the air duct body 31 and further improve the peripheral-side sealing performance of the fan assembly 40 connected to the air duct 30.

In other embodiments, it is also possible that the guide assembly 32 comprises a guide member extending in the direction q, the guide member is fixed to the air duct body 31, and the guide member is in a sliding fit with one of the third side 4113 of the first base plate or the fourth side 4114 of the first base plate, so as to guide the fan assembly 40 to slide in the direction q, simplifying the structure of the guide assembly 32.

Still referring to FIG. 11, the side wall of the air duct 30 provided with the air outlet 312 is further provided with a plurality of sixth mounting holes 313, and the plurality of sixth mounting holes 313 are located between the first guide member 321 and the second guide member 322 and are arranged close to the air outlet 312. The sixth mounting holes 313 are used to mount the fan assembly 40. The power supply device 1 further comprises third fixing members (not shown in the figures). The first mounting member 41 is provided with fifth mounting holes 4115, and the third fixing members are configured to pass through the fifth mounting holes 4115 and be connected to the sixth mounting holes 313 of the air duct 30, so as to fix the first mounting member 41 to the air duct 30.

Further, three fifth mounting holes 4115 are provided, and the three fifth mounting holes 4115 are arranged at intervals in the first base plate 411 in the direction m and are located at a rear end of the first base plate 411 in the direction q. In this form, the fifth mounting holes 4115 are provided close to an assembly operation side of a worker, so that it is easy for the worker to use the third fixing members to fix the first mounting member 41 to the air duct 30.

The third fixing member is similar to the foregoing first fixing member 481 (referring to FIG. 8), and may specifically be a screw or a rivet. Details are not further described herein.

In other embodiments, it is also possible that the first mounting member 41 is connected to the air duct body 31 in another form, such as welding or snap connection.

Further, the first mounting member 41 comprises a limiting portion 414, and the air duct 30 comprises a fitting portion 33. The limiting portion 414 is configured to abut against the fitting portion 33 of the air duct 30 to limit sliding of the first mounting member 41 in the direction q. The limiting portion 414 is configured such that when the limiting portion 414 abuts against the fitting portion 33, the air outlet 312 of the air duct 30 is aligned with the first opening 413 of the fan assembly 40, thereby ensuring that the air duct 30 is connected to the fan assembly 40 in a peripheral-side sealed manner.

As shown in FIG. 11, in some embodiments, the limiting portion 414 and the fitting portion 33 are configured to abut against each other at the rear end of the first base plate 411 inserted into the guide assembly 32 in the direction q. The fitting portion 33 is located at an outer end of the guide assembly 32 in the direction q, and the limiting portion 414 is located at the rear end of the first base plate 411 in the direction q. In this form, the outer end of the guide assembly 32 can be used as the fitting portion 33, which simplifies the structure of the air duct 30, and makes it easy to observe whether the fitting portion 33 abuts against the limiting portion 414.

Figure 12:
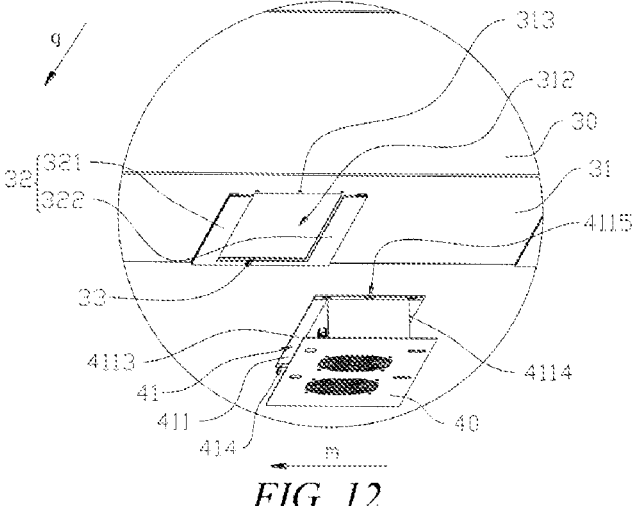
FIG. 12 is a schematic diagram of assembly of a fan assembly disclosed in an embodiment of the present application and an air duct in another form.

FIG. 12 shows a schematic diagram of assembly of a fan assembly 40 disclosed in an embodiment of the present application and an air duct 30 in another form, illustrating another arrangement of the limiting portion 414 and the fitting portion 33.

As shown in FIG. 12, in other embodiments, the limiting portion 414 and the fitting portion 33 are configured to abut against each other at a front end of the first base plate 411 inserted into the guide assembly 32 in the direction q. The fitting portion 33 is located between the first guide member 321 and the second guide member 322, and is located at an inner end of the guide assembly 32 in the direction q, and the limiting portion 414 is located at the front end of the first base plate 411 in the direction q. In this form, the front end of the first base plate 411 can be used as the limiting portion 414 to abut against the fitting portion 33, which simplifies the structure of the fan assembly 40 and facilitates the manufacturing and forming of the fan assembly 40.

Figure 13:
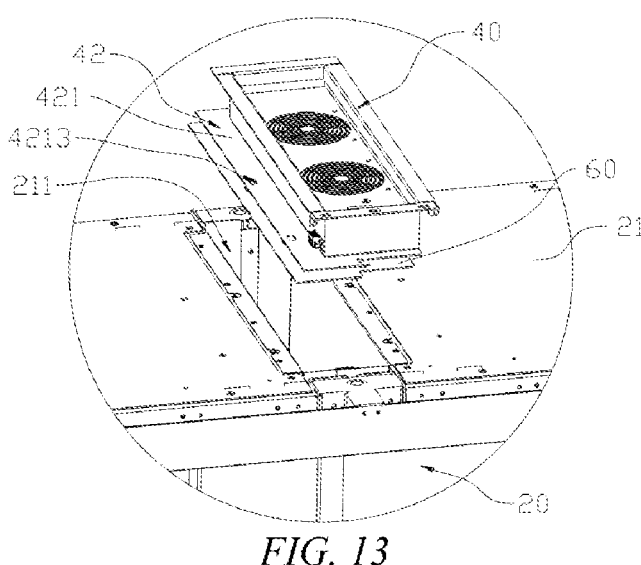
FIG. 13 is a schematic diagram of assembly of a fan assembly disclosed in an embodiment of the present application and a battery storage apparatus.

FIG. 13 shows a schematic diagram of assembly of a fan assembly 40 disclosed in an embodiment of the present application and a battery storage apparatus 20.

As shown in FIG. 12, the second base plate 421 of the second mounting member 42 of the fan assembly 40 is further provided with a seventh mounting hole 4213 for connection to the mounting frame 21 of the battery storage apparatus 20.

As shown in FIG. 13, a sealing member 60 is arranged between the second base plate 421 and the battery storage apparatus 20 and is arranged around the air inlet 211, to implement sealed connection between the second mounting member 42 and the battery storage apparatus 20.

The power supply device 1 in this embodiment of the present application has been described above, and a method for manufacturing a power supply device 1 in an embodiment of the present application will be described below. For parts not described in detail, reference can be made to the foregoing embodiments.

FIG. 14 shows a schematic diagram of steps of a method for manufacturing a power supply device 1.

As shown in FIG. 13, the method for manufacturing a power supply device 1 comprises the following steps.

At step S1, a case 10 is provided.

At step S2, a battery storage apparatus 20 is provided.

At step S3, an air duct 30 is provided.

At step S4, a fan assembly 40 is provided.

At step S5, the battery storage apparatus 20 and the air duct 30 are mounted within the case 10.

At step S6, a first mounting member 41 is mounted to the air duct 30 to bring a first opening 413 into communication with an air outlet 312.

At step S7, a second mounting member 42 is mounted to the battery storage apparatus 20 to bring a second opening 423 into communication with an air inlet 211.

The implementation order of the steps of the foregoing method for manufacturing a power supply device 1 is not particularly limited, and the implementation order of the steps of the foregoing method for manufacturing a power supply device 1 is not the only implementation order.

In the foregoing manufacturing process, there is inevitably a mounting error in the steps of mounting the battery storage apparatus 20 and the air duct 30 within the case 10, resulting in a deviation of relative position of the air inlet 211 and the air outlet 312. The first mounting member 41 is first mounted to the air duct 30, and then the second mounting member 42 is mounted to the battery storage apparatus 20. The deformation of the flexible connecting sleeve 43 is used to adapt to a change in the relative position of the first mounting member 41 and the second mounting member 42, so that the peripheral-side sealing performance of the air inlet 211 and the air outlet 312 can be kept even if there is a mounting error between the battery storage apparatus 20 and the air duct 30, thereby not only avoiding the air volume loss caused by air leakage, but also ensuring the heat dissipation performance of the power supply device 1.

Although the present application is described with reference to the preferred embodiments, various improvements may be made thereto, and the components thereof may be replaced with equivalents, without departing from the scope of the present application. In particular, the technical features mentioned in various embodiments can be combined in any manner as long as there is no structural conflict. The present application is not limited to specific embodiments disclosed herein, but includes all technical solutions that fall within the scope of the claims.

The invention claimed is:

1. A power supply device, comprising:

a case;

a battery storage apparatus, configured to store a battery, mounted within the case and provided with an air inlet;

an air duct mounted within the case and provided with an air outlet; and a fan assembly, wherein the fan assembly comprises:

a first mounting member provided with a first opening;

a second mounting member provided with a second opening;

a flexible connecting sleeve having a first end connected to the first mounting member and a second end connected to the second mounting member, the flexible connecting sleeve being configured to communicate the first opening with the second opening; and a fan arranged within the flexible connecting sleeve and configured to promote flow of gas from the first opening to the second opening, wherein the first mounting member is mounted to the air duct to bring the first opening into communication with the air outlet, and the second mounting member is mounted to the battery storage apparatus to bring the second opening into communication with the air inlet.

2. The power supply device according to claim 1, wherein the fan assembly further comprises:

a first fixing ring configured to fix the first end of the flexible connecting sleeve to the first mounting member, wherein the first end of the flexible connecting sleeve is fitted over the first mounting member, and the first fixing ring is fitted over the first end of the flexible connecting sleeve.

3. The power supply device according to claim 2, wherein the fan assembly further comprises:

a first fixing member, wherein the first fixing ring is provided with a first mounting hole, the first end of the flexible connecting sleeve is provided with a second mounting hole, and the first fixing member is configured to pass through the first mounting hole and the second mounting hole and be connected to the first mounting member, so as to fix the first end of the flexible connecting sleeve to the first mounting member.

4. The power supply device according to claim 3, wherein the fan assembly further comprises:

a second fixing ring configured to fix the second end of the flexible connecting sleeve to the second mounting member, wherein the second end of the flexible connecting sleeve is fitted over the second mounting member and the second fixing ring is fitted over the second end of the flexible connecting sleeve.

5. The power supply device according to claim 4, wherein the fan assembly further comprises:

a second fixing member, wherein the second fixing ring is provided with a third mounting hole, the second end of the flexible connecting sleeve is provided with a fourth mounting hole, and the second fixing member is configured to pass through the third mounting hole and the fourth mounting hole and be connected to the second mounting member, so as to fix the second end of the flexible connecting sleeve to the second mounting member.

6. The power supply device according to claim 1, wherein the first mounting member comprises a first base plate and a first connecting member, the first base plate is provided with the first opening, the first connecting member is arranged on a side of the first base plate facing the flexible connecting sleeve, the first connecting member is arranged around the first opening, and the first end of the flexible connecting sleeve is fitted over the first connecting member.

7. The power supply device according to claim 1, wherein the first mounting member comprises a first sub-base plate, a second sub-base plate, and a first connecting member, the first opening is formed in the first connecting member, the first sub-base plate and the second sub-base plate are symmetrically arranged with respect to the first connecting member, and the first end of the flexible connecting sleeve is fitted over the first connecting member.

8. The power supply device according to claim 1, wherein the second mounting member comprises a second base plate and a second connecting member, the second base plate is provided with the second opening, the second connecting member is arranged on a side of the second base plate facing the flexible connecting sleeve, the second connecting member is arranged around the second opening, and the second end of the flexible connecting sleeve is fitted over the second connecting member.

9. The power supply device according to claim 8, wherein the fan is fixed to a side of the second base plate facing the flexible connecting sleeve, the second connecting member is arranged around the fan, and the second connecting member is provided with a wiring hole for allowing a wire harness of the fan to pass through.

10. The power supply device according to claim 8, wherein the fan assembly further comprises:

a cover plate, which is arranged opposite the second base plate, is fixed to the fan, and is configured to limit a wire harness of the fan between the cover plate and the second base plate.

11. The power supply device according to claim 1, wherein the fan is fixed to the second mounting member.

12. The power supply device according to claim 1, wherein the flexible connecting sleeve is made of a fabric or resin material.

13. The power supply device according to claim 1, wherein the air duct comprises an air duct body and a guide assembly, the air outlet is arranged on the air duct body, the guide assembly is fixed to the air duct body, and the guide assembly is configured to guide the first mounting member to slide in an extension direction of the guide assembly, such that the air outlet is in communication with the first opening.

14. The power supply device according to claim 13, further comprising:

a third fixing member, wherein the first mounting member is provided with a fifth mounting hole, the air duct is provided with a sixth mounting hole, and the third fixing member is configured to pass through the fifth mounting hole and be connected to the sixth mounting hole, so as to fix the first mounting member to the air duct; and the first mounting member comprises a limiting portion, the air duct comprises a fitting portion, the limiting portion is configured to abut against the fitting portion to limit sliding of the first mounting member along the guide assembly, and the limiting portion is configured to align the fifth mounting hole with the sixth mounting hole when the limiting portion abuts against the fitting portion.

15. The power supply device according to claim 1, further comprising:

a sealing member arranged between the second mounting member and the battery storage apparatus and surrounding the air inlet, to implement sealed connection between the second mounting member and the battery storage apparatus.

* * * * *